(12) United States Patent
Sleeman et al.

(10) Patent No.: US 10,503,329 B2
(45) Date of Patent: Dec. 10, 2019

(54) CAPACITIVE SENSING APPARATUS AND METHODS

(71) Applicant: TouchNetix Limited, Fareham, Hampshire (GB)

(72) Inventors: Peter Timothy Sleeman, Waterlooviur (GB); Stephen William Roberts, Winchester (GB); Christopher Kyle Ard, Chandlers Ford (GB)

(73) Assignee: TouchNetix Limited, Fareham Hampshire (GB)

( * ) Notice: Subject to any disclaimer, the term of this patent is extended or adjusted under 35 U.S.C. 154(b) by 0 days.

(21) Appl. No.: 15/578,268

(22) PCT Filed: Jun. 30, 2016

(86) PCT No.: PCT/GB2016/051967
§ 371 (c)(1),
(2) Date: Nov. 30, 2017

(87) PCT Pub. No.: WO2017/017402
PCT Pub. Date: Feb. 2, 2017

(65) Prior Publication Data
US 2018/0157353 A1 Jun. 7, 2018

(30) Foreign Application Priority Data
Jul. 27, 2015 (GB) .................................. 1513156.8

(51) Int. Cl.
| | |
|---|---|
| *G06F 3/041* | (2006.01) |
| *G06F 3/044* | (2006.01) |
| *G01D 5/241* | (2006.01) |
| *H03K 17/975* | (2006.01) |
| *H03H 3/08* | (2006.01) |

(52) U.S. Cl.
CPC ............ *G06F 3/044* (2013.01); *G01D 5/241* (2013.01); *G01D 5/2417* (2013.01);
(Continued)

(58) Field of Classification Search
None
See application file for complete search history.

(56) References Cited

U.S. PATENT DOCUMENTS

| | | |
|---|---|---|
| 2008/0174321 A1 | 7/2008 | Kang et al. |
| 2011/0148811 A1* | 6/2011 | Kanehira ................ G06F 3/044 |
| | | 345/174 |

(Continued)

FOREIGN PATENT DOCUMENTS

| | | |
|---|---|---|
| EP | 2 546 730 A2 | 1/2013 |
| WO | 2008/009687 A2 | 1/2008 |

OTHER PUBLICATIONS

International Search Report and Written Opinion for corresponding Patent Application No. PCT/GB2016/051967 dated Oct. 7, 2016.
(Continued)

*Primary Examiner* — Joseph R Haley
(74) *Attorney, Agent, or Firm* — Renner, Otto, Boisselle & Sklar, LLP

(57) ABSTRACT

A capacitive sensor comprising: a first electrode; a displacement element moveably mounted relative to the first electrode; and a second electrode coupled to the displacement element so that displacement of the displacement element along a displacement direction changes a separation between the first electrode and the second electrode; and a controller element configured to selectively operate in a displacement sensing mode and in a proximity sensing mode, wherein in the displacement sensing mode, the controller element is configured to electrically couple the second electrode to a reference potential and to electrically couple the first electrode to capacitance measurement circuitry to measure a capacitance characteristic of the first electrode to determine a displacement of the displacement element relative to the reference electrode; and in the proximity sensing mode, the controller element is configured to electrically couple the (Continued)

second electrode to capacitance measurement circuitry to measure a capacitance characteristic associated with the second electrode to detect the presence of an object in proximity to the second electrode; and in the displacement sensing mode, the controller element is configured to electrically couple the second electrode to a reference potential signal.

31 Claims, 4 Drawing Sheets

(52) U.S. Cl.
CPC ............ *G06F 3/0416* (2013.01); *H03H 3/08* (2013.01); *H03K 17/975* (2013.01); *G06F 3/0414* (2013.01); *G06F 3/04142* (2019.05); *G06F 2203/04101* (2013.01); *G06F 2203/04105* (2013.01)

(56) References Cited

U.S. PATENT DOCUMENTS

| | | | |
|---|---|---|---|
| 2012/0050180 A1* | 3/2012 | King .................... | G06F 3/0416 345/173 |
| 2012/0200524 A1* | 8/2012 | Vallis ..................... | G06F 3/044 345/174 |
| 2013/0076375 A1* | 3/2013 | Hanumanthaiah ... | H03K 17/962 324/661 |
| 2013/0257784 A1 | 10/2013 | Vandermeijden et al. | |
| 2014/0360854 A1 | 12/2014 | Roziere | |

OTHER PUBLICATIONS

Combined Search and Examination Report for corresponding United Kingdom Patent Application No. GB 1513156.8 dated Mar. 29, 2016.

\* cited by examiner

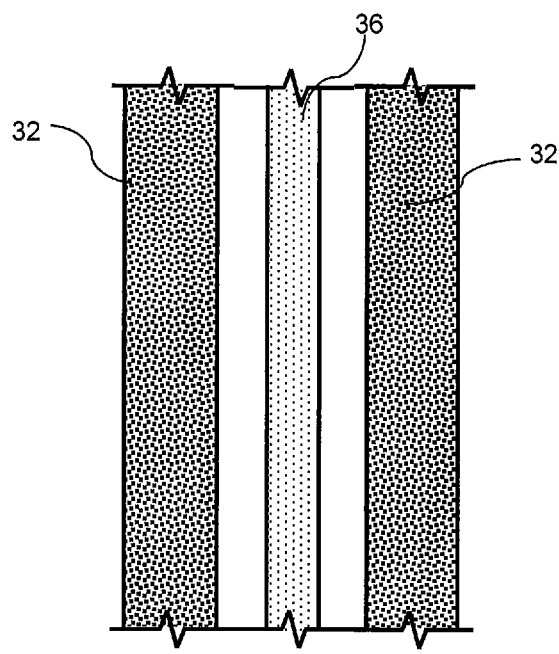
Fig. 6
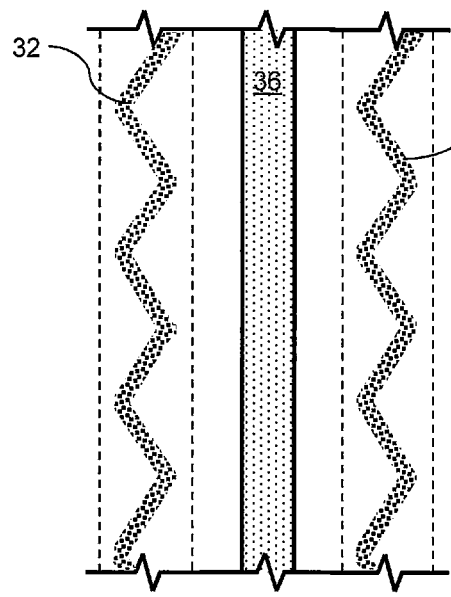 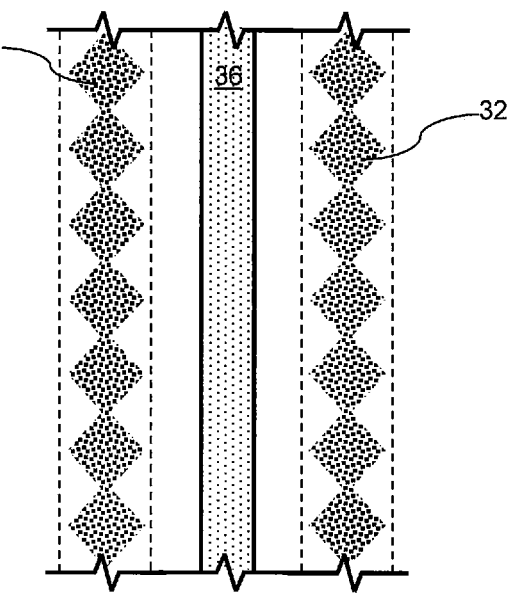
Fig. 7A                Fig. 7B

Displacement sensing
(no displacement)

Displacement sensing
(displacement)

Proximity sensing
(no proximate object)

Proximity sensing
(proximate object)

CAPACITIVE SENSING APPARATUS AND METHODS

This application is a national phase of International Application No. PCT/GB2016/051967 filed Jun. 30, 2016 and published in the English language, which claims priority to United Kingdom Patent Application No. GB 1513156.8 filed Jul. 27, 2015, which are hereby incorporated herein by reference.

BACKGROUND OF THE INVENTION

The present invention relates to the field of capacitive sensing, and in particular to capacitance measurement based displacement and proximity sensing, for example to detect when an object, such as a user's finger, presses on a moveable surface and when an object, such as a user's finger, approaches the moveable surface.

Capacitive sensing techniques have become widespread for providing touch-sensitive inputs, for example in computer tablets, mobile phones, and in many other applications. Touch sensitive input devices are generally perceived to be more aesthetically pleasing than input devices that are based on mechanical switches. Nonetheless, the present inventors have recognised there are still situations in which a user-interface that is responsive to mechanical input may be desired. In particular, the inventors have recognised there are situations in which there is a desire to measure the physical displacement of a displacement element, for example to provide the equivalent of a "click" when navigating a cursor across a display screen using a touch sensor. Furthermore, the inventors have recognised it can be desirable to provide such functionality using capacitive sensing techniques rather than mechanical switching techniques, for example because capacitive sensing techniques typically provide for more reliable sensors as they are less prone to mechanical wear.

One issue with using capacitive techniques for sensing the displacement of an element is the potential for the presence of whatever is causing the displacement, such as a user's finger, to affect the capacitance measurements in addition to the effect of the displacement itself. Capacitive-based capacitive sensors can be designed to reduce sensitivity to approaching objects to help avoid this issue. However, the inventors have further recognised there can be situations in which proximity detection may be desired in conjunction with displacement detection. For example, there may be situations in which it is desirable to detect when an object is approaching a capacitive sensor prior to any displacement occurring, for example to configure an apparatus being controlled by the capacitive sensor into a particular mode in expectation of a displacement. Alternatively, there may simply be a desire to sense the displacement of a surface and the proximity of an object over the surface for independent reasons.

Thus, there is therefore a desire to provide apparatus and methods for sensing when there is a displacement of a surface as well as when there is an object in proximity to the surface. In this regard, it will be appreciated that the reasons why there is a desire for proximity and displacement to be detected will be different in different scenarios and the particular reasons for detecting both proximity and displacement are not significant to the principles underlying the detection techniques described herein.

SUMMARY OF THE INVENTION

According to a first aspect of certain embodiments there is provided a capacitive sensor comprising: a first electrode; a displacement element moveably mounted relative to the first electrode; and a second electrode coupled to the displacement element so that displacement of the displacement element along a displacement direction changes a separation between the first electrode and the second electrode; and a controller element configured to selectively operate in a displacement sensing mode and in a proximity sensing mode, wherein in the proximity sensing mode, the controller element is configured to electrically couple the second electrode to capacitance measurement circuitry to measure a capacitance characteristic associated with the second electrode to detect the presence of an object in proximity to the second electrode; and in the displacement sensing mode, the controller element is configured to electrically couple the second electrode to a reference potential signal (e.g. a system reference potential such as ground or a time varying guard signal).

According to another aspect of certain embodiments there is provided an apparatus comprising the capacitive sensor of the first aspect.

According to another aspect of certain embodiments there is provided a method of capacitive sensing comprising: providing a capacitive sensor comprising a first electrode; a displacement element moveably mounted relative to the first electrode; and a second electrode coupled to the displacement element so that displacement of the displacement element along a displacement direction changes a separation between the first electrode and the second electrode; and selectively operating in one of a displacement sensing mode and a proximity sensing mode, wherein in the proximity sensing mode, the second electrode is electrically coupled to capacitance measurement circuitry to measure a capacitance characteristic associated with the second electrode to detect the presence of an object in proximity to the second electrode; and in the displacement sensing mode, the second electrode is electrically coupled to a reference potential signal.

It will be appreciated that features and aspects of the invention described above in relation to the first and other aspects of the invention are equally applicable to, and may be combined with, embodiments of the invention according to other aspects of the invention as appropriate, and not just in the specific combinations described above.

BRIEF DESCRIPTION OF THE DRAWINGS

The invention is now described by way of example only with reference to the following drawings in which:

FIG. 6 schematically shows a part of the capacitive sensor of FIG. 1 in plan view;

FIGS. 7A and 7B schematically show parts of capacitive sensors according to certain other embodiments of the invention in plan view;

DETAILED DESCRIPTION

Aspects and features of certain examples and embodiments of the present invention are discussed/described herein. Some aspects and features of certain examples and embodiments may be implemented conventionally and these are not discussed/described in detail in the interests of brevity. It will thus be appreciated that aspects and features of apparatus and methods discussed herein which are not described in detail may be implemented in accordance with any conventional techniques for implementing such aspects and features.

Figure 1:
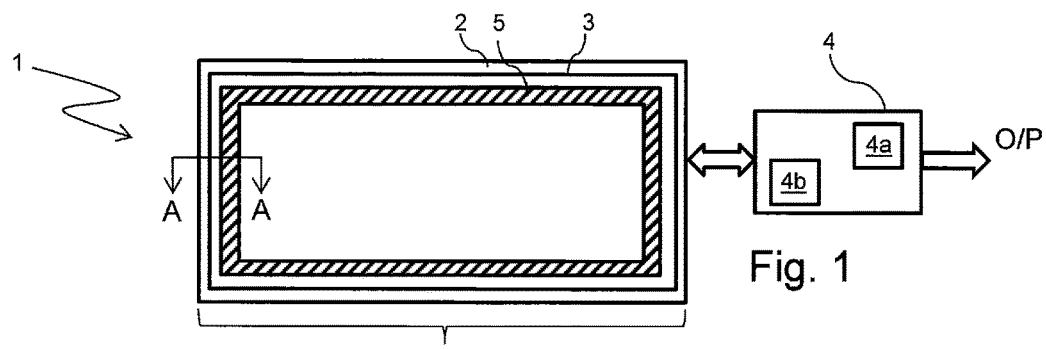
FIG. 1 schematically represents a displacement element and controller element of a capacitive sensor according to certain embodiments of the invention.
Figure 2:
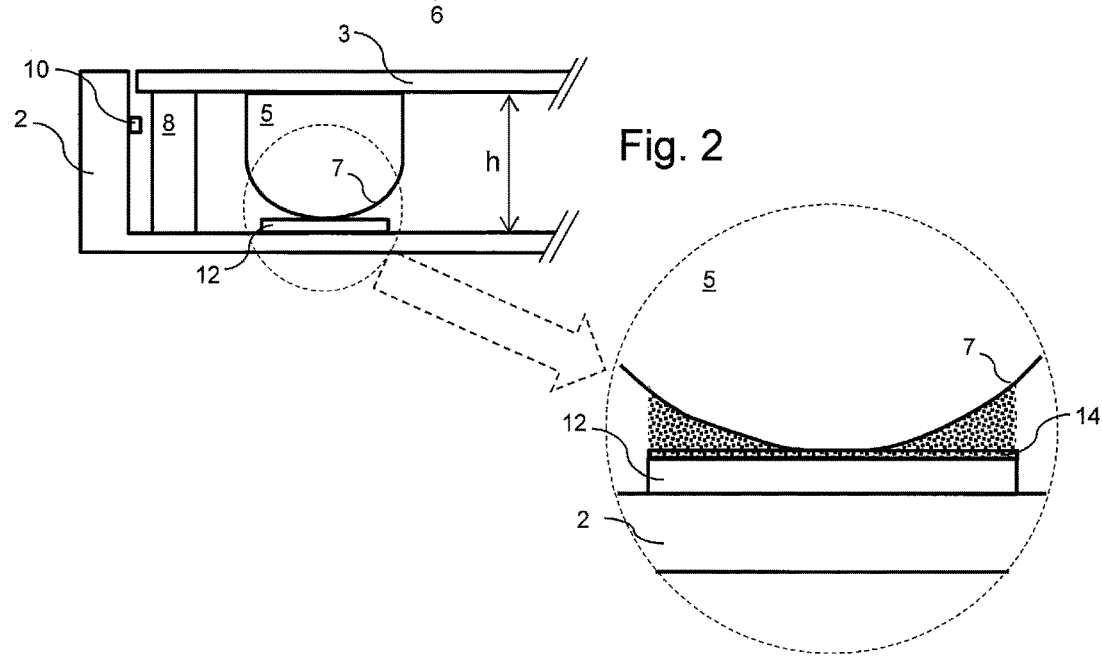
FIG. 2 schematically shows in cross-section a portion the capacitive sensor of FIG. 1 in a non-displaced state.
Figure 3:
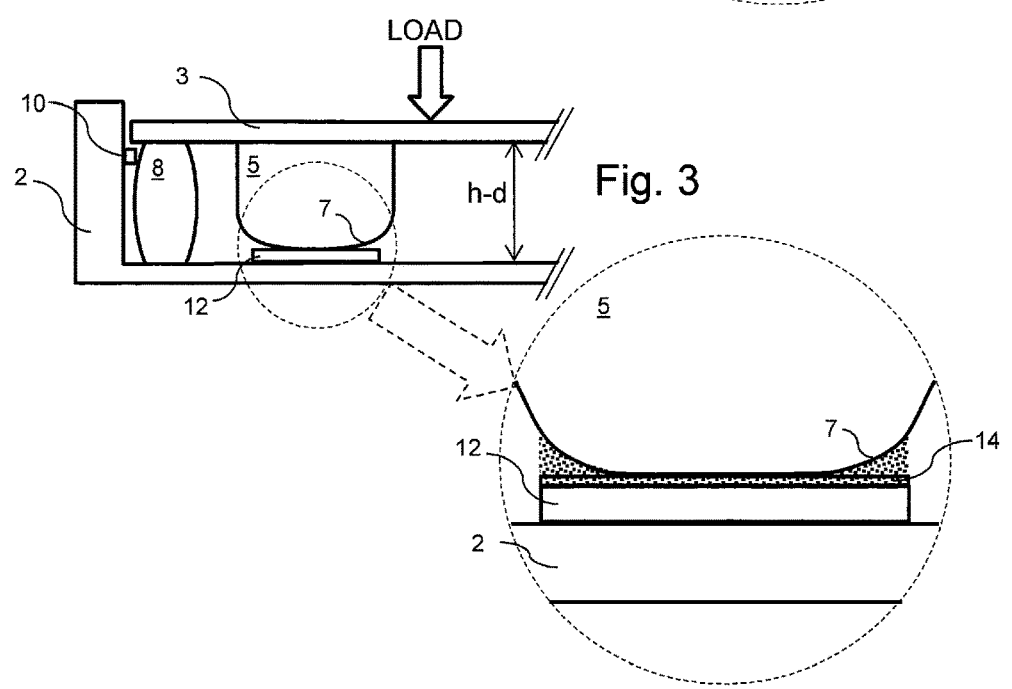
FIG. 3 schematically shows in cross-section a portion the capacitive sensor of FIG. 1 in a displaced state.

FIGS. 1, 2 and 3 schematically represent various aspects of a capacitive sensor 1 in accordance with certain embodiments of the invention. The capacitive sensor 1 comprises two main functional parts, namely a sensor element 6 and a controller element 4. As discussed further below, the control element 4 is configured to selectively control the capacitive sensor to operate in a plurality of different modes, and in particular, a displacement sensing mode in which the capacitive sensor is configured to sense displacements, and a proximity sensing mode in which the capacitive sensor is configured to sense the presence of an object in proximity to the capacitive sensor. Switching between different modes of operation is achieved in accordance with certain embodiments of the invention by switching between different ways of connecting electrodes associated with the control element 6 to capacitance measurement circuitry associated with the controller element 4. That is to say, in a displacement sensing mode of operation the controller element 4, and in particular capacitance measurement circuitry associated with the controller element for is connected to respective electrodes of the sensor element 6 in a first way, while in a proximity sensing mode of operation, capacitance measurement circuitry of the controller element 4 is connected to the respective electrodes of the sensor element 6 in a second way, which is different from the first way.

In the following description, the configuration of the sensor element 6 and the way in which its electrodes may be coupled to the capacitance measurement circuitry of the controller element 4 are primarily described in the context of its displacement sensing mode of operation with the proximity sensing mode of operation being described subsequently.

Thus, FIG. 1 schematically represents the sensor element 6 in plan view and the controller element 4 in highly schematic form (i.e. as a functional block). FIGS. 2 and 3 respectively show portions of the sensor element 6 of the capacitive sensor 1 in cross-section (taken on the line A-A represented in FIG. 1), with FIG. 2 showing the sensor in a non-displaced (rest) state and FIG. 3 shows the sensor in a displaced state.

The capacitive sensor 1 is taken to be operating in the displacement sensing mode, and as such is arranged to measure a displacement of a first element 3 relative to a second element 2, for example in response to a user pressing on the first element 3. This is achieved by measuring changes in capacitive coupling associated with a deformable electrode 5 arranged between the first element 3 and second element 2 and a reference electrode 12, as discussed further below.

The second element 2 of the sensor element 6 may comprise part of, or be fixedly mounted to, a housing of a device in which the capacitive sensor 1 is incorporated. In this context the second element 2 may for some implementations be conveniently referred to as a frame element 2. The first element 3 is movably mounted relative to the frame element 2 so that it may be moved by the application of a load along a displacement direction. In this context the first element 3 may for some implementations be conveniently referred to as a displacement element 3. However, it will be appreciated that in general it is a relative displacement between the two elements which is sensed, and in this regard the terms frame element and displacement element could equally be reversed. For example, it could be the first element 3 that is considered to be the "fixed" (frame) element with the second element 2 being considered the "movable" (displacement) element according to the specific configuration at hand.

The displacement element 3 in this example is in the form of a planar rectangle, but other shapes may be used. The size of the displacement element 3 may be chosen according to the implementation at hand to provide the desired area over which a displacement force is to be detected. Purely for the sake of a specific example, it will be assumed here the displacement element 3 has a size of around 12 cm (width)×8 cm (height)×0.3 cm (thickness). The displacement element 3 in this example is formed of a non-conductive material, for example a glass or plastic material. The displacement element 3 may be transparent or opaque according to the application at hand. For example, in some implementations a display screen may be provided below the sensor element 6. In this case the displacement element 3 (and any parts of the frame element 2 overlying the display screen) should be transparent, at least to some extent, to allow a user to see the display screen through the sensor element 6. In other cases there may be a desire from a design perspective to hide what is behind the displacement element 3 (for example because there is internal wiring or structural elements of an apparatus in which the sensor element 6 is mounted which are not intended to be visible to the user for aesthetic reasons). In this case the substrate may be opaque.

The displacement element 3 is the part of the capacitive sensor 1 to which a load is applied during use (e.g. by a user pressing on the displacement element 3) to cause movement of the displacement element 3 relative to the frame element 2 (or more particularly, relative to the reference electrode 12 associated with the frame element 2, as discussed further below). It is this movement which is sensed by the capacitive sensor 1. The load may be applied directly to an outer surface of the displacement element 3 or indirectly, for example, depending on whether an outer cover layer/panel is provided.

The outer surface of the displacement element 3 (i.e. the surface represented in the plan view of FIG. 1 and shown uppermost in the cross-section views of FIGS. 2 and 3) is the side of the displacement element 3 to which a load is applied during normal use. The application of an example load during use, e.g. corresponding to a user pressing a finger on the displacement element 1, is schematically shown in FIG. 3 by the arrow labelled "LOAD". For ease of explanation, the side of the capacitive sensor 1 to which the load is applied in normal use may sometimes be referred to herein as the "upper" or "outer" side of the capacitive sensor (or similar terminology such as "top"), with the other side being referred to as "lower" or "inner" (or similar terminology, such as "bottom"). Thus, the surface of the displacement element 3 shown uppermost in the orientation of FIGS. 2 and 3 may sometimes be referred to as the upper/outer/top surface of the substrate capacitive sensor 1. Likewise, the lowermost surface of the displacement element 3 for the orientation of FIGS. 2 and 3 may sometimes be referred to as the bottom/lower/inner surface of the substrate 2. Corresponding terms may similarly be used in respect of other parts of the capacitive sensor in accordance with the orientation shown in the relevant figures. However, it will be appreciated this terminology is used purely for convenience of explanation and is not intended to suggest a particular orientation of the capacitive sensor 1 should be adopted in normal use. For example, although in the orientation of FIGS. 2 and 3 the upper surface of the sensor element 6 is shown uppermost, the sensor element 6 could equally be used in a downward facing configuration, or facing outwards from a vertical surface, according to the implementation at hand. More generally, the capacitive sensor may be incorporated in a portable apparatus (such as a tablet computer or mobile telephone), and in that case the orientation in use will vary according to how a user happens to be holding the apparatus.

The frame element 2 provides a structural support for the displacement element 3 and will typically be connected to, or comprise an integral part of, an apparatus in which the capacitive sensor 1 is provided. The frame element 2 may comprise any suitable structural material, for example it may be formed from metal or plastic. The frame element 2 in this example defines a recess/opening into which the displacement element 3 is received and moveably supported therein by a support element 8 arranged around a peripheral part of the displacement element. In this example the movable mounting of the displacement element 3 relative to the frame element 2 is provided by virtue of the support element 8 comprising a resiliently compressible material. An upper edge of the support element 8 is bonded to the underside of the displacement element 3 and a lower edge of the support element 8 is bonded to the frame element 2. Conventional bonding techniques can be used for bonding the support element 8 to the other parts of the capacitive sensor, for example having regard to bonding techniques appropriate for the materials involved.

The support element 8 in this example is thus generally in the form of a rectangular ring arranged around a peripheral part of the displacement element 3. The support element 8 has a generally rectangular cross-section when in its relaxed state (as shown in FIG. 2), although when the support element 8 is compressed by virtue of a load being applied to the displacement element 3, its sides may bow out to accommodate the movement, as schematically indicated in FIG. 3. It will, however, be appreciated that other shapes could be used in accordance with established mounting practices. For example, more complex shapes for the support element 8 may be chosen to provide different degrees of compressibility according to the degree to which the support element is already compressed. The displacement element 6 may be provided with a stop 10 to limit the extent to which the support element 8 may be compressed (i.e. to limit the extent to which the displacement element may be displaced relative to the frame element 2). In this example such a stop is provided by a suitably arranged protrusion 10 from a side wall of the recess defined by the frame element 2. This protrusion may extend all around the recess or may be provided at a number of discrete locations around the recess.

In this example implementation the support element 8 also functions as a sealing gasket and so forms a closed loop around the whole periphery of the displacement element 3. However, it will be appreciated the support element 8 need not be a single component extending all around the sensor element, but may comprise a number of separate components, for example a number of separate support pillars arranged around the capacitive sensor with one at each corner of the displacement layer 3. It will also be appreciated that other configurations may be used for the resiliently compressible support element 8, for example, the support element may comprise one or more springs.

The support element 8 in this example comprises an elastomeric material having an appropriate degree of rigidity and compressibility according to the application at hand (i.e. providing a desired level of resistance to compression). In some cases there may be a desire for a material having relatively low compressibility, thereby requiring a relatively high load to generate a given displacement of the displacement element 3 relative to the frame element 2. Conversely, in some cases there may be a desire for a material having relatively high compressibility, thereby requiring a relatively low load to generate a given displacement of the displacement element 3 relative to the frame element 2. This will be a question of design choice. For example, in the context of capacitive sensor forming a user interface a designer may choose how hard the user must press to cause a given displacement. This may be done, for example, to balance the risk of accidental activation against requiring too great a force for activation. A material having the desired degree of compressibility may be selected from modelling or empirical testing, for example.

The recess provided in the frame element 2 is arranged in this example so the upper surface of the displacement element 3 broadly aligns with the upper surface of that part of the frame element 2 surrounding the displacement element 3 (with a gap therebetween to allow for the relative movement), to give the general impression of a continuous outer surface for the apparatus in which the capacitive sensor 1 is incorporated. If desired, a flexible seal may be provided to cover the gap between the displacement element 3 and the surrounding surface of the frame element 2. More generally, it will be appreciated there are various structural configurations whereby a frame element may be arranged to support a displacement element 3 in such a way that the displacement element and frame element are movable relative to one another in accordance with established manufacturing techniques.

The frame element 2 may extend under the entire area of the displacement element 3 or may have an opening in a central portion, for example to accommodate a display screen. In cases where the displacement element 3 overlies a display screen, the display screen may be mounted to the displacement element 3, so that it moves with it, or may be mounted to the frame element 2, so that it does not move with the displacement element 3.

The deformable electrode 5 between the displacement element 3 and the frame element 2 follows a generally rectangular path around (i.e. within and adjacent to) a peripheral region of the displacement element 3 and has a generally "D" shaped cross-section. Thus, the deformable electrode 5 comprises an upper flat surface which abuts the lower surface of the displacement element 3 (and may be bonded thereto), two side walls which are generally aligned with the direction along with displacements are to be sensed (i.e. vertical for the orientation represented in FIGS. 2 and 3), and a lower curved wall 7, which may also be referred to as a contact surface 7 for the deformable electrode 5. In this particular example the deformable electrode 5 forms a substantially closed path (i.e. closed or nearly closed) around the entire periphery of the substrate and has approximately the same height and width in cross-section, for example around 0.5 cm. The deformable electrode 5 in this example follows a path that is around 1 cm from the peripheral edge of the displacement element. However, it will be appreciated the specific geometry of the deformable electrode, e.g. in terms of its cross-sectional size, separation from the peripheral edge of the displacement element 3, and the extent to which it extends around the whole periphery, may be different in different implementations.

The deformable electrode may be formed in any of a number of different ways. In this example the deformable electrode comprises a suitably profiled elastomeric conductive foam that may be provided in accordance with conventional techniques for forming conductive foam products. However, in other examples other configurations may be adopted, for example the deformable electrode may comprise a conductive rubber material, a conductive plastics material, a sprung metal structure or may be formed by a flexible conductive sheath, for example a web of metallic wires, surrounding a compliant core, for example a rubber/silicone core or an air chamber.

An electrical connection to the deformable electrode 8 to allow for the measurements discussed further below may be provided in various ways. For example, one or more conductors, such as wires, may be embedded in the deformable electrode 8 and connected back to external circuitry, or a surface of the deformable electrode may abut one or more electrical contact pads that are connected back to external circuitry with appropriate wiring.

Between the deformable electrode 5 and the frame element 2 is a reference electrode 12. The reference electrode is generally in alignment with the deformable electrode and follows a corresponding path beneath the deformable electrode. An upper surface of the reference electrode 12 is provided with an electrical insulator layer 14 (shown schematically in the magnified parts of FIGS. 2 and 3). The insulator layer prevents the overlying deformable electrode 5 from coming into direct electrical contact with the reference electrode 12 when the deformable electrode 12 is pressed against the reference electrode 12 during displacement of the displacement element 3 towards the frame element 2.

The reference electrode 12 may be provided in a number of different ways. In this example the reference electrode is provided by a conductive trace deposited on the frame element 2, for example a copper foil bonded to the frame element 2, and having a width broadly corresponding to that of the deformable electrode, for example around 0.5 cm. The insulator layer 14 may also be provided in a conventional manner, for example comprising a plastic film or layer of plastic/resin encapsulant over the reference electrode 12. It will, however, be appreciated that different techniques can be used in different implementations. For example the reference electrode could be provided as a structurally distinct element, for example comprising a conductive trace mounted to a printed circuit board, such as a flexible printed circuit board, arranged at the appropriate location between the deformable electrode 5 and the frame element 2. Also, the reference electrode need not comprise a conductive trace, and may instead comprise wiring that provides conductivity over a broadly corresponding area, for example using a plurality interconnected parallel wires and/or a mesh of wires provided under the deformable electrode 5. Although the reference electrode 12 is schematically represented in FIGS. 2 and 3 as being disposed on top of the frame element 2 in other examples the reference electrode may be embedded within the frame element 2. If the frame element 2 is conductive, the reference electrode 12 may be insulated therefrom. It will be appreciated the reference electrode 12 and insulator layer 14 might typically be relatively thin compared to the other elements of the sensor element 6 shown in FIGS. 2 and 3, but these figures are not drawn to scale with the reference electrode 12 (and its layer of insulation 14) shown with exaggerated thickness in the cross-sections of FIGS. 2 and 3 for ease of representation.

FIG. 2 schematically represents the sensor element 6 in a rest state with no displacement load applied to the displacement element 3. In this example the gap between the upper surface of the frame element 2 and a lower surface of the displacement element 3 is, as indicated in FIG. 2, h. This gap h corresponds with the height of the support element 8 in its relaxed state. In this example the support element 8 is sized to provide a gap h that is a little under 0.5 cm, for example 0.4 cm. As noted above, the deformable electrode 5 in this example has a height of around 0.5 cm, and therefore is maintained under slight compression when the displacement element 3 is bonded to the frame element 2 via the support element 8. Providing the deformable electrode 5 under slight compression can help to accommodate variations in the geometry of the capacitive sensor arising from manufacturing tolerances. Thus, and as can be seen in particular in the magnified part of FIG. 2 shown in the dashed circle, the lowest part of the contact surface 7 of the deformable electrode 5 is biased into contact with the insulator layer 14 overlying the reference electrode 12. Thus, there is a portion of the contact surface 7 for which there is no free space (air gap) gap between the deformable electrode 5 and the frame element 2, even when in the rest (non-displaced) state.

FIG. 3 schematically represents the sensor element 6 in a displaced state in which a displacement load is applied to the displacement element 3, as schematically indicated by the arrow labelled LOAD. The displacement load may, for example, be provided by a user's finger pressing on the outer surface of the displacement element 3. The support element 8 and the deformable electrode 5 are both compressed under the action of the displacement load allowing the displacement element 3 to move along a displacement direction towards the frame element 2 by an amount d. The magnitude of the displacement d will be a function of the force (load) applied and the combined resilience of the support element 8 and the deformable electrode 5. The displacement element 3 in FIG. 3 is schematically shown as remaining parallel when displaced, but in general it may be expected the displacement element 3 may be tilted depending on the location of the load (i.e. the value of d may be different at different positions across the displacement element 3). In this example the magnitude of the displacement d is assumed to be around 0.1 cm.

As a consequence of the deformable electrode 5 being squashed under the displacement load, the curved contact surface 7 is pressed harder against the underlying insulator layer 14. This causes the contact surface 7 to flatten against the insulator layer 14, thereby reducing the overall volume between the deformable electrode 5 and the reference electrode 12 as compared to the rest state represented in FIG. 2. The space between the deformable electrode 5 and the reference electrode 12 is schematically shown with shading in FIGS. 2 and 3, and it can be seen how the shading in FIG. 3 occupies a smaller area than the shading in FIG. 2.

Because the volume of the space between the deformable electrode 5 and the reference electrode 12 is reduced under the displacement load, the capacitive coupling between the deformable electrode 5 and the reference electrode 12 increases when the displacement load is applied. The controller element 4 is configured to measure a characteristic of the capacitive coupling associated the two electrodes, thereby allowing a determination as to whether a displacement has occurred to be made. As discussed further below, there are various different ways in which a characteristic of the capacitive coupling between the two electrodes can be measured. For example, the mutual capacitive coupling between the two electrodes could be measured by applying a drive signal to one of the electrodes and measuring the extent to which the drive signal is coupled to the other of the electrodes. Alternatively, the self-capacitance of one of the electrodes could be measured with respect to a reference potential whilst the other electrode is connected to the reference potential (e.g. a system ground or other system reference potential). In yet another example, one of the electrodes may comprise two components which are capacitively coupled to one another. For example the reference electrode 12 of FIGS. 1 to 3 may be replaced with a reference electrode comprising a pair of parallel or interdigitated conductors which are insulated from one another but in a relatively close proximity on the frame element 2, with the gap between them underlying the deformable electrode 5. The mutual capacitive coupling between the two conductors comprising the reference electrode could be measured by applying a drive signal to one of the conductors and measuring the extent to which the drive signal is coupled to the other of the conductors. The component of the drive signal coupled between the electrodes will generally be reduced as the overlying deformable electrode is compressed on to them under the displacement load.

Thus, having described the structural configuration of some capacitive sensors in accordance with certain embodiments of the invention, the operation of an example capacitive sensor will be described with regard to the functionality provided by the control element 4.

The controller element 4 comprises capacitance measuring circuitry 4a and processing circuitry 4b. The capacitance measuring circuitry 4a is configured to measure a capacitance characteristic associated with the electrodes 5, 12 comprising the capacitive sensor (e.g. a measure of the mutual capacitance between them or the self-capacitance of one of them). The processing circuitry 4b of the control element 4 is configured to determine a displacement of the displacement element 3 relative to the frame element 2 from the measurements of the capacitance characteristic, for example with a change in the measured capacitance characteristic being taken to indicate a change in displacement.

The controller element 4 comprises circuitry which is suitably configured/programmed to provide the functionality described herein using conventional programming/configuration techniques for capacitive sensors. The capacitance measuring circuitry 4a and signal processing circuitry 4b are schematically shown in the figures as separate elements for ease of representation. However, it will be appreciated that the functionality of these components can be provided in various different ways, for example using a single suitably programmed general purpose computer, or field programmable gate array, or suitably configured application-specific integrated circuit(s)/circuitry or using a plurality of discrete circuitry/processing elements for providing different elements of the desired functionality.

The capacitance measurement circuitry 4a may be coupled to the deformable electrode 5 and the reference electrode 12 in different ways according to different embodiments, as mentioned above and discussed further below. Connections between the capacitance measurement circuitry and the respective electrodes can be established in accordance with conventional techniques, for example using appropriate wiring. In some example embodiments the electrodes may be connected to a reference potential, e.g. a system ground/earth potential, or other reference potential. Again these connections can be established using conventional techniques. In principle connections to the reference potential could be made via the capacitance measurement circuitry in the control element 4, but could also be made directly and independently from the capacitance measurement circuitry (for example by connecting directly to a chassis of an apparatus in which the capacitive sensor is provided and which is maintained at the relevant reference potential). For simplicity the system reference potential may sometimes be referred to herein as a system ground or earth, but it will be appreciated the actual potential itself may be arbitrary and is not significant (e.g. it could be 0V, 5V or 12V, or any other value according to the implementation at hand)

The capacitance measurement circuitry 4a may operate to measure the relevant capacitance characteristic of the electrodes in accordance with any conventional techniques, and as already mentioned, the capacitance measurement circuitry 4a may be configured to measure a self-capacitance of one or other electrode or a mutual-capacitance between them, or between different parts of one of the electrodes. The textbook "Capacitive Sensors: Design and Applications" by Larry K. Baxter, August 1996, Wiley-IEEE Press, ISBN: 978-0-7803-5351-0 [1] summarises some of the principles of conventional capacitive sensing techniques that may be used for measuring a capacitance characteristic in accordance with embodiments of the invention. More generally, any established techniques for measuring a degree of capacitive coupling could be adopted.

In accordance with a first embodiment the capacitance measurement circuitry 4a may be configured to measure a self-capacitance of the reference electrode 12 while the deformable electrode 5 is connected to a system reference potential. In accordance with conventional techniques, measuring the self-capacitance of the reference electrode 12 may be performed by applying a drive signal to the reference electrode 12 that varies in time relative to system ground (or other reference potential) and determining the extent to which the drive signal is capacitively coupled to system ground via conductive paths in the vicinity of the reference electrode that are connected to the system ground potential. For arrangements in accordance with embodiments of the invention such as represented in FIGS. 1 to 3, the presence of the deformable electrode 5 provides a major contribution to the extent to which the reference electrode 12 is capacitively coupled to the reference potential. Furthermore, the magnitude of this capacitive coupling depends on the separation (offset) between the different parts of the reference electrode 12 and the deformable electrode 5. Consequently, the magnitude of the capacitive coupling between the two electrodes depends on the volume between them. Therefore, this self-capacitance of the reference electrode 12 changes when the displacement element 3 is displaced under load thereby compressing the deformable electrode 5 towards the reference electrode 12. The processing circuit 4b is configured to receive indications of the measured capacitance characteristic of the reference electrode from the capacitance measurement circuitry 4a and determine a displacement of the displacement element 3 relative to the frame element 2 (more particularly relative to the reference electrode 12) in response thereto.

In some cases the processing circuitry 4b may be configured to determine an absolute value for a displacement, for example by converting an individual capacitance measurement (or average of several capacitance measurements) to a displacement offset based on a calibration function. The calibration function may, for example, be based on modelling or established in an initial setup procedure in accordance with conventional capacitance measurement techniques. In particular, a baseline value (corresponding to a measurement of the relevant capacitance characteristic of the second electrode when there is no displacement) may be established at various times, for example when the capacitive sensor is initially turned on. The calibration function may then be used to convert differences in capacitance measurement from the baseline measurement to corresponding displacements.

In other cases, the processing circuitry may be configured to in effect provide a binary indication as to whether or not there has been a displacement greater than a threshold displacement. For example, the processing circuitry may be configured to identify when there has been a change in measured capacitance that is greater than a pre-defined trigger threshold, and to determine that this corresponds with a displacement by more than an amount corresponding to the pre-defined threshold displacement. An appropriate value for the pre-defined trigger threshold in any given implementation can be established empirically having regard to the extent of displacement which is desired to trigger a determination that displaced has occurred, and may be dynamically chosen to suit a given application.

The processing circuitry 4b may further be configured to provide an output signal ("O/P") indicating the status regarding the displacement determination. This may be provided, for example, to a controller of a host apparatus in which the capacitive sensor 1 is arranged. It will be appreciated the response of the host apparatus to the output from the controller element 4 is purely an implementation matter and will depend on the reason why the displacement is being sensed in any given application. That is to say, it is not significant to the principles of displacement sensing as described herein why the displacement is being sensed.

It will be appreciated a self-capacitance approach such as described above could similarly be adopted with the capacitance measurement circuitry 4a instead configured to measure a self-capacitance of the deformable electrode 5 while the reference electrode 12 is connected to a system reference potential. That is to say, the connections to the deformable electrode 5 and the reference electrode 12 could simply be reversed (the self-capacitance of the deformable electrode 5 will equally be affected by the change in separation between the two electrodes). In general, it may be preferable for whichever of the two electrodes is on the side of the displacement element 6 from which the load is normally applied in use to be the one connected to the system reference potential. This is to help reduce any effect that an approaching object, such as a user's finger, might have on the self-capacitance measurement. In effect, the electrode which is connected to the reference potential may be used to help "screen" the other electrode for which the self-capacitance measurement is made from an approaching object, thereby reducing the chance of an approaching object giving rise to a change in measured self-capacitance that leads to a false-determination of displacement being made. In situations where there is considered to be a high risk of such false-determinations being made, further screening can be applied. For example, a grounded plane may be provided on the upper surface of the displacement element 3.

In accordance with a second embodiment the capacitance measurement circuitry 4a may be based on a mutual-capacitance measurement approach. In this configuration, the capacitance measurement circuitry may be configured to apply a time-varying drive signal to the deformable electrode 5 and to measure the extent to which the drive signal is capacitively coupled to the reference electrode 12, again using conventional capacitance measurement techniques. The magnitude of the mutual capacitive coupling between the electrodes depends on the separation between the different parts of the reference electrode 12 and the deformable electrode 5, which were integrated over the electrodes corresponds with the volume between them. Thus the mutual-capacitance between the reference electrode 12 and the deformable electrode 5 changes when the deformable electrode 5 is compressed towards the reference electrode 12 under the application of a displacement load to the displacement elements 3. The processing circuitry 4b may be configured to receive and process measurements from the capacitance circuitry 4a in accordance with this mutual-capacitance based example embodiment in the same manner as described above for the self-capacitance based example embodiment.

It will be appreciated a mutual-capacitance based approach such as described above could similarly be adopted with the capacitance measurement circuitry 4a instead configured to apply a time-varying drive signal to the reference electrode 12 and to measure the extent to which the drive signal is capacitively coupled to the deformable electrode 5. That is to say, the connections between the capacitance measurement circuitry and the two electrodes could in effect be reversed. In a corresponding manner to that described above for a self-capacitance approach, in general, it may be preferable for whichever of the two electrodes is on the side of the displacement element 6 from which the load is normally applied in use to be the one connected to the drive signal. This can again help reduce any effect that an approaching object, such as a user's finger, might have on the mutual-capacitance measurement. In situations where there is considered to be a high risk of such false-determinations being made, additional guarding/shielding can be applied. For example, a planar guard electrode may be provided on the upper surface of the displacement element 3 to cover the under-lying deformable electrode 5 and the reference electrode 12, and the drive signal applied to the relevant one of the deformable electrode and reference electrode may also be applied to the guard electrode.

It will be appreciated there are various further combinations with regards to how the capacitance measurement circuitry may be coupled to the electrodes of the displacement element 6. For example, in some other implementations, a capacitive sensor may have a generally similar structural configuration to that described above, but the reference electrode 12 may in effect be split into a first part and a second part having a capacitive coupling between them. Capacitance measurement circuitry may then be configured to measure the extent to which a drive signal applied to the first part is coupled to the second part of the reference electrode while the deformable electrode 5 is connected to a system reference potential. The extent to which the drive signal is coupled from the first part to the second part of the reference electrode will be affected by the proximity of the deformable electrode. The measurements of capacitive coupling between the first and second parts of the reference electrode can again be made using conventional capacitance measurement techniques. This style of mutual capacitance measurement may sometimes referred to as a "transverse" arrangement in recognition of the fact the coupled electric fields between the two parts of the split reference electrode are generally oriented in a transverse manner relative to their supporting substrate (i.e. the frame element 2 in this example).

In principle, and as with the other embodiments, the functionality of the reference electrode 12 and the deformable electrode 5 could again be reversed in so far as they are connected to the external measurement circuitry/reference potential. That is to say, in some examples the deformable electrode 5 may be at the electrode which is divided into two (or more) parts (conductors) between which the mutual capacitive coupling is measured while the reference electrode is connected to a system reference potential. However, in practice such a configuration is likely to be more structurally complex than a configuration in which it is the fixed reference electrode that is split into multiple parts.

Thus, and as will be understood by those skilled in the art, there are various different ways in which the electrodes can be driven to measure different characteristics associated with the degree of capacitive coupling between the deformable electrode 5 and the reference electrode 12. Any of these approaches may be used for determining a displacement of the displacement element 3 with respect to the frame elements 2 through the effect the subsequent distortion of the deformable electrode 5 has on its capacitive coupling to the reference electrode 12. In some cases the measured characteristic of capacitive coupling may directly relate to the mutual capacitive coupling between the two electrodes, whereas in other cases the measured characteristic may be something which is not in itself a direct measure of the capacitive coupling between the electrodes, but is something which is affected by changes in the capacitive coupling between the two electrodes, for example the self-capacitance of one or other of the electrodes or the mutual-capacitance between two or more components of one of the electrodes.

Figure 4A:
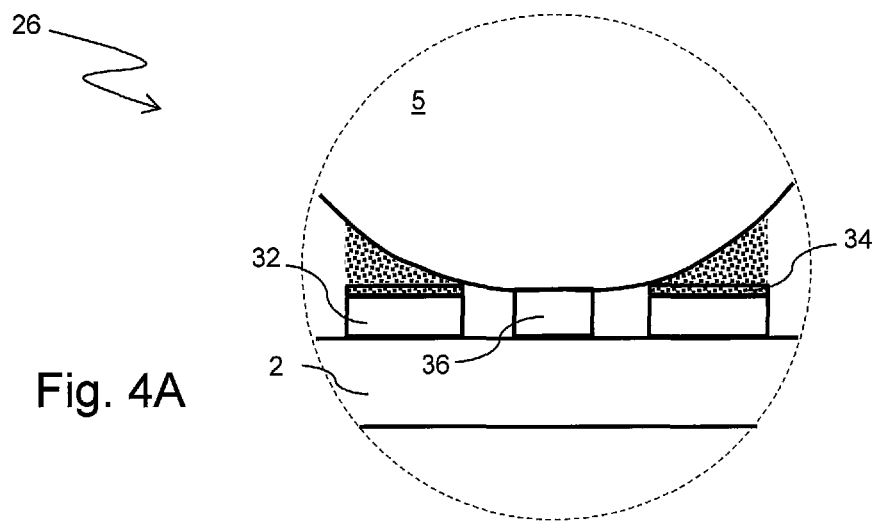
FIGS. 4A and 4B schematically show a portion of a capacitive sensor according to certain other embodiments of the invention in a non-displaced state in FIG. 4A and a displaced state in FIG. 4B.
Figure 4B:
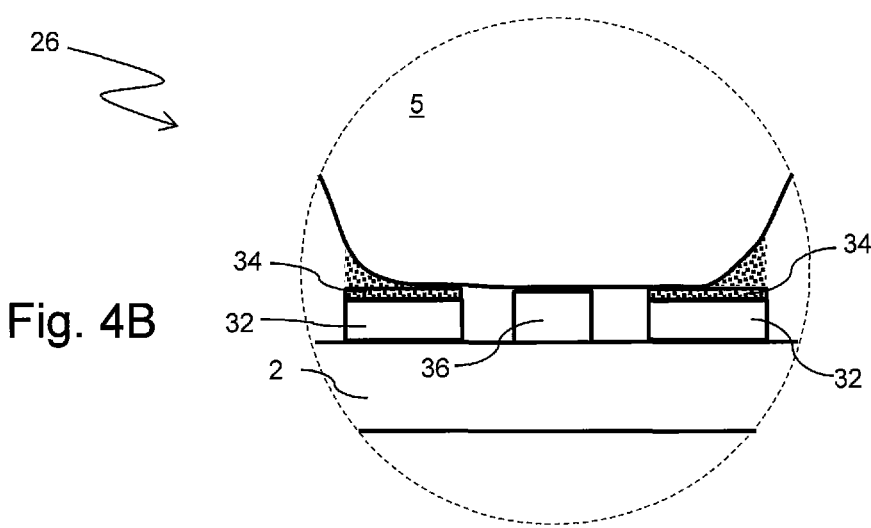

FIGS. 4A and 4B schematically represent a magnified portion of a sensor element 26 in accordance with certain other embodiments of the invention. FIG. 2 schematically represents the sensor element 26 in a rest state while FIG. 3 schematically represents the sensor element 26 in a displaced state in which a displacement load is applied. In this regard, FIGS. 4A and 4B are similar to, and will be understood from, the magnified portions of the sensor element 6 represented in FIGS. 2 and 3 respectively. However, the sensor element 26 represented in FIGS. 4A and 4B differs from the sensor element 6 represented in FIGS. 1 to 3 in the specific configuration of its reference electrode and the manner in which electrical contact is established to the deformable electrode 5. Apart from these differences, the capacitive sensors of FIGS. 1 to 3 and FIGS. 4A and 4B may otherwise be the same with corresponding elements in each being identified by corresponding reference numerals.

Thus, whereas the reference electrode 12 represented in the sensor element 6 FIG. 2 is in the form of a single trace extending under the deformable electrode 5 and having a broadly corresponding width, the capacitive sensor 26 of FIGS. 4A and 4B comprises a reference electrode 32 comprising two traces which are interconnected and which are arranged on either side of a central contact electrode 36. The respective traces comprising the reference electrode 32 may be formed in the same manner as discussed above, and they also comprise an insulating layer 34 preventing the components of the reference electrode 32 from establishing direct electrical contact with the overlying deformable electrode 5. In effect, the reference electrode 32 of FIGS. 4A and 4B may be considered to correspond closely with the reference electrode 12 of FIGS. 2 and 3, except for having a gap in the middle running around the length of the reference electrode and in which the contact electrode 36 is arranged.

Unlike the reference electrode 32, the contact electrode 36 is not provided with an insulating layer. Therefore, the deformable electrode 5 is in electrical contact with the contact electrode 36. In this regard to the contact electrode 36 provides a manner for connecting the deformable electrode to external circuitry, for example so as to apply a drive signal to the deformable electrode 5, or to connect the deformable electrode at a system reference potential.

Apart from these differences, a capacitive sensor based on the sensor element 26 represented in FIGS. 4A and 4B may otherwise operate in the same manner as described above for the displacement element 6 represented in FIGS. 2 and 3. That is to say, when the displacement element 3 is compressed (squashed) under the application of a displacement load, the volume of space between the deformable electrode and the underlying reference electrode (shown with shading in FIGS. 4A and 4B) is reduced, which, as mentioned above, changes the capacitive coupling between them. Thus, by measuring a characteristic of the capacitive coupling between the deformable electrode 5 and the reference electrode 32, the occurrence of a displacement can again be identified.

Figure 5:
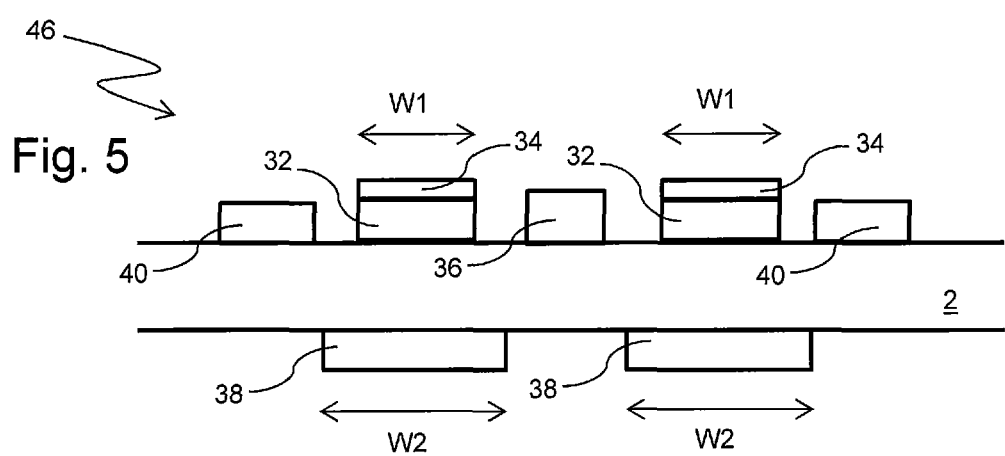
FIG. 5 schematically shows an electrode arrangement of a capacitive sensor according to certain other embodiments of the invention.

FIG. 5 schematically represents a portion of a sensor element 46 in accordance with certain other embodiments of the invention. The sensor element 46 represented in FIG. 5 is similar to, and will be understood from, the sensor element 26 represented in FIGS. 4A and 4B. However, the sensor element 46 represented in FIG. 5 differs from the sensor element 26 represented in FIGS. 4A and 4B in additionally containing shield/guard electrodes 38, 40. Apart from this difference, a capacitive sensor comprising the sensor element 46 of FIG. 5 may operate in broadly the same manner as a capacitive sensor comprising the displacement element 26 of FIGS. 4A and 4B with corresponding elements in each being identified by corresponding reference numerals.

The shield electrodes 38, 40 may be used in accordance with broadly conventional techniques to reduce the sensitivity of the measured characteristic of capacitive coupling to external influences, for example resulting from an approaching object which gives rise to the measured displacement. In the example of FIG. 5, there is a shield electrode 38 placed beneath each part of the reference electrode 32 on an opposing side of the frame element 2 (and having a width W2 greater than the width W1 of the overlying part of the reference electrode 32), and also a shield electrode 40 placed adjacent to each part of the reference electrode 32 on the same side of the frame element (the opposite side to the contact electrode 36). These shield electrodes 38, 40 running under and/or around the reference electrode 32 may be driven in the same way as the reference electrode 32, thereby reducing the apparent capacitive coupling of the reference electrode 32 to other elements of the capacitive sensor 1 (i.e. what might be termed parasitic capacitance). This can help sensitivity to what might be relatively small changes in capacitive coupling caused by displacement of the displacement element. It will be appreciated that similar shield/guard electrodes can be provided for all embodiments, and furthermore that some embodiments may only use shield/guard electrodes below the reference electrode or around the reference electrode, rather than using both.

FIG. 6 schematically shows in plan view (i.e. along a view direction which is parallel to the displacement direction) portions of the reference electrode 32 and contact electrode 36 of the displacement element 26 represented in FIGS. 4A and 4B. As discussed above, the respective portions of the reference electrode 32 comprise traces of uniform width. However, in accordance with other embodiments, such as schematically represented in FIGS. 7A and 7B, the reference electrode 32 might comprise a more complex pattern. For example, the respective components of the reference electrode 32 in the example represented in FIG. 7A follow a generally zigzag pattern, whilst the reference electrodes 32 in the example represented in FIG. 7B follow a pattern of interconnected diamonds. More generally, surface(s) of the reference electrode(s) facing the deformable electrode may be arranged in a varying pattern along a direction that is parallel to an axis of general extent of the reference electrode (and the overlying deformable electrode) which is substantially orthogonal to the displacement direction. This approach may be adopted to increase the relative change in capacitive coupling caused by deformation of the deformable electrode 5 as compared to the rest state capacitive coupling between them, thereby increasing overall sensitivity.

In the examples discussed above, the contact surface 7 of the deformable electrode 5 is generally in the form of a curved surface. However, in other examples a linear surface could be used, for example a wide "V" shape, or a simple incline across the whole lower surface, could be used. What is significant in accordance with certain embodiments is that in the rest state a part of the deformable electrode may rest against another part of the capacitive sensor which is fixed in position relative to the reference electrodes (e.g. a part of the deformable electrode may be in contact the insulator layer overlying the reference electrode and/or a contact electrode). By providing this rest-state contact in conjunction with a deformable electrode, the lower surface of the deformable electrode facing the reference electrode may be easily located in a readily repeatable position relative to the reference electrode, thereby reducing sensitivity to manufacturing tolerances.

In accordance with certain embodiments, the contact surface of the deformable electrode is inclined relative to the opposing surface of the reference electrode by an angle that is greater than 5 degrees and less than an angle selected from the group comprising 45 degrees, 40 degrees, 35 degrees, 30 degrees, 25 degrees, 20 degrees, 15 degrees and 10 degrees. These kinds of values can be expected to provide suitable levels of performance. In some respects, the shallower the angle the greater the sensitivity to displacements as the reduction in the volume between the electrodes relative to the rest state volume between the electrodes will be greater for a given magnitude of displacement. However, in some cases a steeper angle may be preferred to provide sensitivity to a wider range of displacement magnitudes.

It will be appreciated there are various modifications to the approaches described above that can be adopted in accordance with other embodiments of the invention.

For example, whereas the insulator layers discussed above have been provided on the surface of the reference electrode, an insulator layer could instead, or in addition, be provided on the deformable electrode.

Furthermore, whereas the above-described embodiments have focused on an arrangement in which the reference electrode is underneath the deformable electrode from the point of view of the direction from which the load is applied, in another configuration the reference electrode could be on top of the deformable electrode (i.e. on the same side as that from which the load is applied). For example, the reference electrode 12 may be provided on an underside of the displacement element 3 in a configuration that is otherwise in accordance with represented that in FIGS. 1 to 3.

Furthermore still, whereas in the above described embodiments the information between the contact surface of the deformable electrode 5 and the reference electrode 12 is provided by a degree of curvature in the service of the deformable electrode 5, the same effect can be achieved by instead having the reference electrode inclined relative to a surface of the deformable electrode that is flat and perpendicular to the displacement direction.

It will also be appreciated the capacitive sensor may be provided with additional functionality. For example, in some cases the displacement element 3 could be provided with a conventional capacitive touch-panel sensor. This may, for example, be provided using a suitably arranged electrode pattern deposited on the outer surface and/or on the inner surface of the displacement element 3. The electrode pattern for the touch-panel aspect may be provided in accordance with conventional techniques. Furthermore, the touch-panel component may also overlay a display (in cases where the various elements overlying the display are transparent). Thus, a capacitive touchscreen featuring displacement sensing can be provided.

It will also be appreciated that in the approaches described above the deformable and reference electrodes each comprise a single continuous electrode associated with a single measurement channel of the of the control circuitry (or reference potential). Nonetheless, the respective electrodes can in principle be divided into multiple parts with separate connections to the control circuitry and/or reference potential. For example, one or other, or both, electrodes could comprise two separate parts which together extend around a portion (e.g. a major portion, such as more than 50%) of the outer periphery of the capacitive sensor, and each part may be connected to a separate capacitive characteristic measurement channel (or in parallel or multiplexed manner to a single capacitance characteristic measurement channel), with the outputs from the separate measurement channels being combined to provide an indication of the combined capacitive characteristics of the different parts forming the second electrode. In another implementation in which one or other (or both) of the respective electrodes are divided into multiple parts, the multiple parts of each electrode could be simply be connected together in parallel to a single measurement channel.

It will further be appreciated that there can be various modifications made to the specific geometries discussed above. For example, different shapes of displacement element may be adopted for different implementations. For example, whereas FIG. 1 shows a rectangular displacement element by way of an example, the displacement element could in general adopt any desired shape, for example a circular or irregular shape.

It will further be appreciated the electrodes may have different shapes in cross-section in different implementations. For example, whereas some of the above-described embodiments have primarily focused on a deformable electrode having a generally D-shaped cross section, in other embodiments other shapes may be adopted. For example, in some implementations the deformable electrode may be generally circular in cross-section. More generally, the deformable electrode may adopt any shape that provides an appropriately-inclined portion of the deformable electrode surface relative to a facing part of the reference electrode so that the surface of the deformable electrode may be progressively squashed/compresses towards the reference electrode when a displacement load is applied so as to reduce the volume of space between them.

In the embodiments primarily discussed above, the deformable electrode is schematically represented as abutting generally planar surfaces of the displacement element and frame element. However, in some implementations the displacement element and/or the frame element may be provided with a groove/recess in which the deformable electrode may be received. This may be provided, for example, to help with locating the deformable electrode. Furthermore, such a groove may be used to help constrain the side-wards expansion of the deformable electrode during compression. It will be appreciated that whilst the above-described embodiments have focused on displacement sensing in the context of providing a user interface, the same principles can be applied more generally wherever there is a desire to measure the displacement of one object relative to another. For example, principles similar to those described above may be used for general switching/displacement indication applications, and furthermore, it will be appreciated the displacement may not be due to activation by a user. For example, in some implementations the same techniques can be used to measure whether one component of an apparatus has moved relative to another component. In the most general sense, it will be appreciated the reasons why a displacement is being measured in any given implementation, and any actions taken in response whether or not a displacement is measured, are not significant to the principles described herein.

The description above has primarily focused on describing the operation of capacitive sensors in accordance with certain embodiments of the invention when operating in a displacement sensing mode. In this regard, in some example implementations the displacement sensing mode of operation may be broadly summarised as a mode in which the controller element is configured to electrically couple the deformable electrode (second electrode) to a reference potential and to electrically couple the reference electrode (first electrode) to capacitance measurement circuitry so as to measure a capacitance characteristic of the reference electrode, e.g. its self-capacitance with respect to the reference potential, to determine a displacement (more particularly, a displacement of the displaceable element to which the deformable electrode is coupled).

However, in accordance with certain embodiments of the invention, the capacitive sensors described above are also configurable to operate in a proximity sensing mode for sensing if there is an object in the vicinity of the displacement element. In some example implementations the proximity sensing mode of operation may be broadly summarised as a mode in which the controller element is configured to electrically couple the deformable electrode (second electrode) to capacitance measurement circuitry so as to measure a capacitance characteristic of the deformable electrode, e.g. its self-capacitance, to determine if there is an object in proximity to the deformable electrode.

Thus, in accordance with some examples the controller element 4 represented in FIG. 1 is configured to selectively operate in a displacement sensing mode as discussed above and in a proximity sensing mode. Thus, in the displacement sensing mode the deformable electrode 5 is connected to a system reference potential (e.g. ground) whilst the reference electrode 12 is connected to capacitance measurement circuitry 4a for measuring displacements as set out above. However, in the proximity sensing mode, the controller is configured to disconnect the deformable electrode 5 from the system reference potential and to instead connect it to the capacitance measurement circuitry 4a so as to measure a capacitance characteristic of the deformable electrode, for example its self-capacitance with respects to the system reference potential. In the proximity sensing mode the reference electrode does not play a direct role in sensing object proximity and may be connected to a guard signal corresponding to the time varying signal applied to the deformable electrode to provide shielding for the capacitance measurements associated with the deformable electrode, or in the alternative the reference electrode may be simply allowed to electrically float or stay connected to the capacitance measurement circuitry.

In some respects an electrode coupled to the capacitance measurement circuitry so the capacitance measurement circuitry can measure a capacitance characteristic that is sensitive to what is being detected (i.e. displacement or object proximity depending on the operating mode) may be referred to as the sense electrode, and in accordance with embodiments of the invention a capacitance-based sensor may be provided which supports different sensing modes (e.g. displacement sensing and object proximity sensing) by switching between which of the electrodes comprising the sensor is currently configured to act as a sense electrode.

The re-configuring of the connections between the capacitance measurement circuitry and the electrodes of the capacitive sensor may, for example, be provided using conventional relays (e.g. based on solid-state switches or mechanical switches) controlled in accordance with conventional switching techniques. It will be appreciated the implementation of the switches may be made in accordance with established techniques for control circuitry. For example the functionality of the switches for reconfiguring the signals connected to the respective electrodes of the capacitive sensor may in principle be provided by discrete relays or by appropriate configuring of a circuit element, e.g. a suitably programmed integrated circuit, that provides the functionality of the capacitance measurement circuitry 4a and/or the processing circuitry 4b. That is to say, the switches may in effect be hardware switches or software switches.

Thus, in the proximity sensing mode the deformable electrode is connected to capacitance measurement circuitry and may generally operate as a proximity sensor in accordance with conventional techniques for proximity sensing. That is to say, the self-capacitance of the deformable electrode, as measured by the capacitance circuitry 4a, will be affected by the presence of an object in the vicinity of the deformable electrode, for example an object which is above, but not pressing on, the displacement element 3, which allows the presence of the object to be detected (to within the sensitivity of the sensor). In particular, the presence of the object leads to an increased capacitive loading on the deformable electrode which may be measured by the capacitance measurement circuitry in accordance with established techniques for capacitive proximity sensing.

As is well established in the field, capacitance measurements in the context of capacitive sensors will typically rely on applying a time-varying signal to the sense electrode and measuring the response, e.g. in terms of how strongly the time-varying signal is coupled to a system reference potential (for self-capacitance) or to another electrode (for mutual-capacitance) to establish a measure of the relevant capacitive characteristic. Driving the reference electrode 12 with a guard signal corresponding to a time-varying signal applied to the deformable electrode when in proximity mode can help reduce the capacitive loading of the reference electrode, i.e. how strongly it is coupled to the system reference potential, when there is no object present, thereby making the deformable electrode more sensitive to proximate objects. Nonetheless, and as noted above, in some implementations the reference electrode might in principle be allowed to electrically float or maintain its connection to the capacitance measurement circuitry. Preferably, although this is not essential, the reference electrode is not connected to a system reference potential in the proximity sensing mode as this can significantly increase the capacitive loading on the deformable electrode, thereby reducing its sensitivity to objects approaching the displacement element 3 overlying the deformable electrode.

It will be appreciated the above-described principle of reconfiguring a capacitive sensor to operate in either one of a displacement sensing mode and a proximity sensing mode by switching how the respective electrodes are connected to capacitance measurement circuitry may be adopted for different configurations of sensor, and is not limited to the specific arrangements described above based on a deformable electrode. That is to say, in accordance with embodiments of the present disclosure, a proximity sensing function/mode of operation may be in effect added to a capacitive sensor having a displacement sensing function/mode of operation regardless of the underlying configuration of the displacement sensing aspects of the capacitive sensor.

Thus, FIGS. 8A, 8B, 9A and 9B schematically represent portions of a capacitive sensor configured to operate in a displacement sensing mode and a proximity sensing mode in accordance with certain other examples of the disclosure. In many respect the capacitive sensor of FIGS. 8A, 8B, 9A and 9B may operate in terms of providing different modes of operation in broadly the same manner as discussed above for the sensors discussed with reference to FIGS. 1 to 7. That is to say, despite being based on a sensor element having electrodes with a different physical structure, the overall functional operation can be the same. Although not shown in the figures, the capacitive sensor of FIGS. 8A, 8B, 9A and 9B again comprise a controller element 4 comprising capacitance measurement circuitry 4a and processing circuitry 4b such as presented in FIG. 1.

Figure 8A:
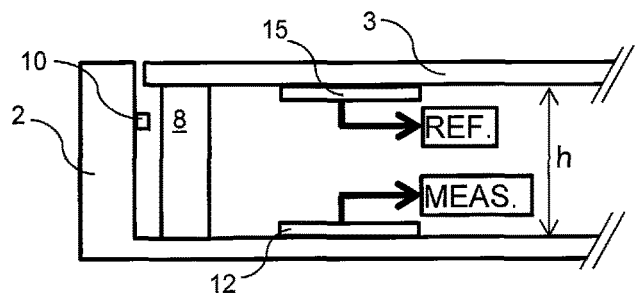
FIGS. 8A and 8B schematically show a portion of a capacitive sensor configured to operate in a displacement sensing mode according to certain embodiments of the invention in a non-displaced state in FIG. 8A and a displaced state in FIG. 8B.
Figure 8B:
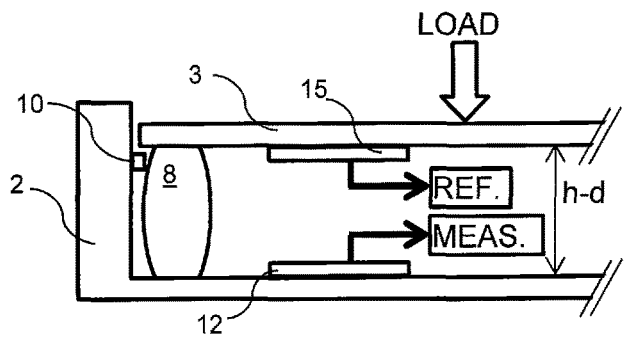
Figure 9A:
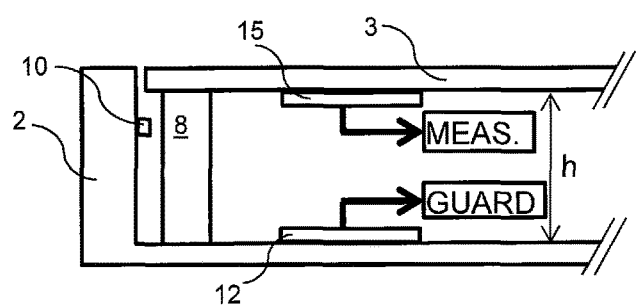
FIGS. 9A and 9B schematically show a portion of the capacitive sensor of FIGS. 8A and 8B configured to operate in a proximity sensing mode according to certain embodiments of the invention with no proximate object in FIG. 9A and with a proximate object in FIG. 9B.
Figure 9B:
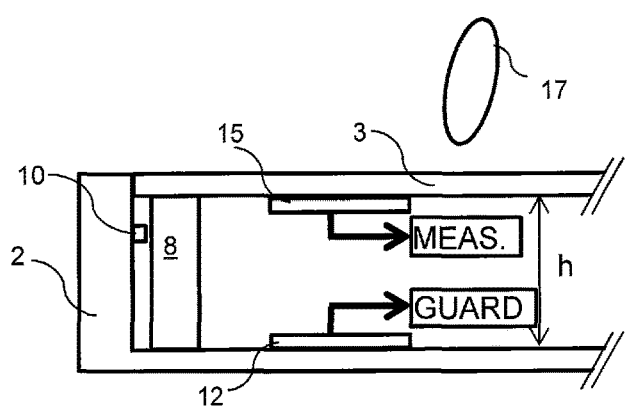

FIGS. 8A and 8B schematically represents the sensor operating in a displacement sensing mode and respectively show the sensor in a non-displaced state (FIG. 8B) and a displaced state (FIG. 8B). FIGS. 9A and 9B schematically represents the sensor operating in a proximity sensing mode and respectively show the sensor with no object proximate the sensor (FIG. 9A) and with an object 17 in proximity to the sensor (FIG. 9B).

In many respects the sensor represented in FIGS. 8 and 9 is similar to, and will be understood from, the sensors discussed above, for example with reference to FIGS. 1 to 3, and corresponding elements are identified by corresponding reference numerals. However, as noted above, the capacitive sensor of FIGS. 8 and 9 is different from the capacitive sensor of FIGS. 1 to 3 in the specific configuration of the electrode coupled to the displacement surface 3. In particular, in the previously discussed examples the electrode coupled to the displacement surface 3 is a deformable electrode 5 that is squashed under displacement to reduce a separation between a lower surface of the deformable electrode 5 and the reference electrode 12. However, in the example of FIGS. 8 and 9, the electrode coupled to the displacement element 3 is in the form of a conductive trace 15, for example of the kind described above for the reference electrode FIG. 12, e.g. a copper, or other conductive material, track disposed on the underside of the displacement element in general alignment with the reference electrode in a corresponding manner to that discussed above for the deformable electrode. Other than its different cross section and material, aspects of the track electrode 15 in the capacitive sensor of FIGS. 8 and 9 may be similar to corresponding aspects of the deformable electrode 5 in the capacitive sensor of FIGS. 1 to 3, for example in terms of how it may be configured to extend around the periphery of the displacement element to in effect overlay the reference electrode. The separation between the electrode 15 mechanically coupled to the displacement element 3 and the reference electrode 12 is changed under displacement (shown as going from h to h-d in FIGS. 8A and 8B), thereby leading to an increase in capacitive loading on the reference electrode 12 due to the reduced separation to the track electrode 15 which is electrically coupled to system reference potential. This change in capacitance for the reference electrode can be measured, and so the displacement detected, in the same manner as described above for the deformable electrode-based configuration. For ease of reference, the reference electrode 12 may sometimes be referred to as a first electrode while the electrode coupled to the displacement element 3 (coupled in the sense of moving relative to the first electrode when the displacement element moves relative to the first electrode), i.e. the track electrode 15 or deformable electrode 5 depending on the embodiment, may sometimes be referred to as a second electrode.

Thus, when operating in the displacement sensing mode as schematically represented in FIGS. 8A and 8B, the first electrode 12 is connected to capacitance measurement circuitry while they second electrode 15 is coupled to a system reference potential, for example ground. In FIG. 8A the capacitive sensor is shown in a non-displaced state whilst in FIG. 8B the capacitive sensor is shown in a displaced state. In this regard, FIGS. 8A and 8B are respectively similar to, and will be understood from, the corresponding portions of FIGS. 2 and 3, the only difference being in the configuration of the electrode coupled to the deformable element 3.

Because in FIG. 8B (displaced state) the first electrode 12 and the second electrode 15 are closer together than in the non-displaced state represented in FIG. 8A, there is a corresponding increase in the capacitive coupling between the two electrodes. As such, the self-capacitance of the first electrode 12 measured by the capacitance measurement circuitry is increased. This change in the capacitance characteristic measured by the capacitance measurement circuitry 4a can thus be used to identify the displacement has occurred in accordance with the principles set out above. In this regard, the operation of the sensor represented FIGS. 8A and 8B for sensing displacement can in essence be the same as described above for the other sensors discussed herein.

Thus, in the displacement sensing mode of operation, the first electrode 12 is coupled to the capacitance measurement circuitry (as schematically indicated in the figures by the label "MEAS.") while the second electrode 15 is coupled to the system reference potential (as schematically indicated in the figures by the label "REF."). The capacitance measurements from the capacitance measurement circuitry are sensitive to changes in the separation between the first electrode and the second electrode and so can be used to identify when there has been a displacement in a manner corresponding to that described above. Because the second electrode is coupled to the system reference potential, the first electrode is, to at least a large degree, screened from the capacitive loading associated with the object causing the displacement, thereby increasing the sensitivity to changes in capacitance caused by displacement between the first and second electrodes, again as discussed above.

To switch from the displacement sensing mode represented FIGS. 8A and 8B to the proximity sensing mode represented in FIGS. 9B and 9B, the controller element of the capacitive sensor is configured to disconnect the second electrode 15 from the system reference potential ("REF.") and to instead connected to the capacitance measurement circuitry ("MEAS."). The control element is further configured in this example to disconnect the first electrode 12 from the capacitance measurement circuitry ("MEAS.") and to connect it to a guard signal (as schematically indicated in the figures by the label "GUARD"). As is well-established in the field of capacitive sensing, a guard signal may correspond with the same time-varying signal applied by the capacitance measurement circuitry to the second electrode 15 in conjunction with the capacitance measurements being made to reduce the effective capacitive loading of the first electrode 12 on the second electrode 15, thereby increasing sensitivity to other sources of capacitive loading (i.e. proximate objects). In this regard, the signalling applied to the first electrode 12 may be considered similar to the signalling applied to the guard/shield electrodes 38 and 40 discussed above in relation to FIG. 5.

For the situation represented in FIG. 9A in which the capacitive sensor is operating in the proximity sensing mode and there is no object in proximity to the sensor (i.e. more particularly in proximity to the second electrode 15), the capacitance measurement circuitry will measure a baseline self-capacitance of the second electrode 15. It will of course be appreciated the reference here to an object not being in proximity to the second electrode 15 is in relation to objects whose presence or non-presence is to be sensed, for example an approaching finger, and not objects which are permanently and statically present (and so do not give rise to temporal changes in capacitance), for example because they form part of the capacitive sensor or an apparatus in which it is mounted.

FIG. 9B is similar to, and will be understood from, FIG. 9A, but shows the situation in which an object 17 to be detected is in proximity to the second electrode 15. This object may, for example, be a user's finger or hand brought into proximity with the capacitive sensor. The reasons why the object is brought into proximity with the capacitive sensor and why there is a desire to detect this will depend on the application at hand and are not significant to the principles underlying the sensing itself. For example, in one implementation the object may be a user's hand that is waved over a capacitive sensor to provide a user input to a device incorporating the capacitive sensor. In another implementation the object may be the lid of a device, for example a laptop computer, and the capacitive sensor may be in the body of the laptop computer and operable to determine when the lid is closed (i.e. when the lid is brought into proximity with the sensor).

When the object 17 is brought into proximity to the second electrode 15, there is an increase in capacitive loading on the second electrode as the object provides another route for capacitively coupling the second electrode to the system reference potential. This leads to an increase in the capacitance measured by the capacitance measurement circuitry coupled to the second electrode, which can be identified and used to determine the presence of the object 17. More generally, once the sensor has been configured for proximity detection in accordance with the principles described in, the actual detection of proximate objects may be made in accordance with established techniques for proximity detection.

In some cases the processing circuitry 4b associated with the capacitive sensor when operating in proximity sensing mode may be configured to simply provide a binary indication as to whether or not there is an object deemed to be present in the region over which the sensor is sensitive. For example, the processing circuitry may be configured to identify when there has been a change in measured capacitance associated with the second electrode 15 that is greater than a pre-defined trigger threshold, and to determine that this corresponds with an increase in capacitive loading associated with an object being present. An appropriate value for the pre-defined trigger threshold in any given implementation can be established empirically having regard to the desired sensitivity and the expected capacitive loading of objects to be sensed (which to a large extent will depend on the size of the object to be sensed).

The processing circuitry 4b may further be configured to provide an output signal ("O/P") indicating the status regarding the determination as to object proximity. This may be provided, for example, to a controller of a host apparatus in which the capacitive sensor is arranged. It will be appreciated the response of the host apparatus to outputs from the controller element 4 indicating an object is in proximity to the sensing element is purely an implementation matter and will depend on the reason why the displacement is being sensed in any given application. That is to say, it is not significant to the principles of proximity sensing as described herein why the determination is being made.

Thus, in accordance with certain embodiments a capacitive sensor may be configured to switch between a displacement sensing mode and a proximity sensing mode by changing how different electrodes of the sensor are connected to capacitance measurement circuitry as discussed above. Thus, increased functionality can be provided for a given structural configuration, and in particular, a proximity sensing function can be added to a displacement sensor without requiring additional electrodes or measurement channels. The manner in which the controller element is configured to switch between the two modes of operation can be selected according to the implementation hand, for example having regard to the reasons why displacement sensing and proximity sensing are being undertaken. For example, in one application the capacitive sensor may be configured to in effect provide continuous sensing of displacements and proximity by operating in the displacement and proximity sensing modes in a time-multiplexed manner, for example by switching between the two modes relatively quickly having regard to the timescales on which displacements are expected to occur, and objects are expected to come into proximity. In other applications the capacitive sensor may operate primarily in one mode and operate in the other mode less often, or only in response to particular conditions. For example, the capacitive sensor made primarily operate in a proximity sensing mode, and only begin operating in a displacement sensing mode once it is determined that an object is approximate to the capacitive sensor. In some example implementations the capacitive sensor may be configured to remain in one particular operating mode until there is a change in state detected for that operating mode. For example, on detecting a displacement, the capacitive sensor may be configured to remain in displacement sensing mode until it is determined the displacement is no longer present.

Thus, in accordance with some of the principles and examples described herein, a displacement sensor is disclosed that can be integrated with various touch panel structures or with any surface that is to be made reactive to displacement by the application of a load. The system in some examples uses a deformable conductive element with a shape chosen so that small mechanical displacements at one surface produce comparatively large changes in the overlap region of that element with an insulated reference electrode, but other configurations may also be used. Also disclosed in some examples is a means to electrically reconfigure the sensing element(s) of the displacement sensor to allow far field proximity sensing of conductive objects.

Once the sensor is appropriately configured in accordance with the principles disclosed herein, the underlying operation in the displacement sensing mode can be generally based on established techniques for capacitive displacement sensing and the operation in proximity mode can be generally based on established techniques for capacitive proximity sensing. Thus, in some respects, some example embodiments of the disclosure may be considered to provide for selectively changing the electrical configuration of a displacement sensor (e.g. in terms of how the respective electrodes are connected to associated circuitry) so the electrodes can additionally be used to detect changes in surrounding electric fields, thereby allowing a non-contact proximity detection to be undertaken. This could be used to detect the approach of a human hand, for example, or any other object of suitable size/conductivity.

It will be appreciated the typical change in capacitance for the first electrode associated with the detection of a displacement in the displacement sensing mode and the typical change in capacitance for the second electrode associated with a proximate object in the proximity sensing mode may not be the same, for example it will depend on the respective sensitivity of the two modes to what is being detected. Thus, in situations where the capacitance measurement circuitry comprises a single sense channel used for both modes of operation (as opposed to situations where the capacitance measurement circuitry comprises separate sense channels for the different modes), the capacitance measurement circuitry may be configured so the gain of the sense channel is changed when switching between the two different operating modes. The gain for each mode may be set having regard to expected magnitudes of capacitance change and desired sensitivity for the application at hand. In this regard the operation of the capacitance measurement circuitry can be tuned, e.g. dynamically tuned, for the different modes of operation having regard to established practices for capacitance measurements for displacement sensing and for proximity sensing.

In many situations the sensor may be implemented in a device that itself provides a degree of capacitive loading that can reduce the sensitivity of the respective measurements. If this is considered to be an issue for a given implementation, established techniques can be used to help reduce these effects. For example, in an implementation where the sensor overlies other conductive element(s), e.g. part(s) of an underlying display screen, it can be advantageous for any such conductive elements to be connected to a guard signal or left to electrically float, at least during times when capacitance measurements are being made. That is to say, in some implementations the capacitive sensor may be incorporated in an apparatus having further circuitry associated with other functionality of the apparatus, for example circuitry associated with a position sensitive touch panel or display screen mounted to or under the displacement element, or even simply a conductive chassis. In some implementations this further circuitry may, at least during times when capacitance measurements are being made, be electrically isolated (in a galvanic sense) from the capacitance measurement circuitry for the displacement/proximity sensing discussed above. The further (ancillary) circuitry of the apparatus may thus be allowed to electrically float or be driven with a guard signal to help reduce the capacitive loading effect of the further circuitry on the displacement sensing/proximity sensing capacitance measurements.

The examples described above have focussed on two-electrode configurations, i.e. with one electrode (which may be referred to as the second/displacement electrode) mounted to the displacement element and one electrode (which may be referred to as the first/reference electrode) mounted to a reference element (e.g. an apparatus chassis) with respect to which the displacement element is movable. In the displacement sensing mode the reference electrode is electrically connected to capacitance measurement circuitry while the first electrode is connected to a reference potential. In the proximity sensing mode it is the second electrode which is connected to capacitance measurement circuitry while the first electrode may be floating or electrically connected to a guard signal. However, it is also possible to adopt similar principles to those described above in displacement sensors having different electrode configurations.

For example, another configuration may be structurally similar to that represented in FIGS. 8 and 9, but with an additional electrode (which may be referred to here as an outer electrode) arranged above, e.g. on the upper surface the displacement element 3, and in alignment with the reference electrode 12 and displacement electrode 14. In a displacement sensing mode for this configuration the outer electrode may be connected to a guard signal to help shield capacitance measurements associated with the other electrodes from being affected by an approaching object. In a proximity sensing mode for this configuration the outer electrode may be connected to the capacitance measurement circuitry to detect the proximity of an approaching object. That is to say, the electrode (or electrodes) connected to the capacitance measurement circuitry in the proximity sensing node (typically the outermost electrode) may be connected to a fixed reference potential in the displacement sensing mode or to a guard signal in the displacement sensing mode depending on the specific electrode configuration adopted. In that sense the electrode connected to the capacitance measurement circuitry in the proximity sensing mode may be considered as being connected to a reference potential signal in the displacement sensing mode, where the reference potential signal may be a fixed reference potential signal (e.g. a system ground) or a time-varying reference potential signal (e.g., a guard signal).

Furthermore, in a configuration having an additional outer electrode which is connected to the capacitance measurement circuitry in proximity sensing mode and which is connected to a ground or guard signal (reference potential signal) in displacement sensing mode, the configuration of electrical couplings between the other electrodes of the sensor and the capacitance measurement circuitry in the displacement sensing mode may vary according to the implementation at hand. That is to say, the electrical configuration for displacement sensing may be based on any known arrangements for capacitively sensing displacements. Thus, in some cases the capacitance measurement circuitry may be connected to an electrode corresponding to what has been referred to above as the reference electrode. However, in other configurations an electrode corresponding to what has been referred to herein as the reference electrode may be instead coupled to a system reference potential, and the capacitance measurement circuitry may be configured in displacement sensing mode to measure a capacitance characteristic of electrode mounted to the displacement element and which is capacitively coupled to the reference electrode. That is to say, in some example implementations the controller element may be configured in the displacement sensing mode to electrically couple the reference electrode to capacitance measurement circuitry to measure a capacitance characteristic associated with the reference electrode to determine a displacement of the displacement element relative to the reference electrode. Alternatively, in some other example implementations the controller element may be configured in the displacement sensing mode to electrically couple a further electrode, which is mounted to the displacement element and capacitively coupled to the reference electrode, to capacitance measurement circuitry to measure a capacitance characteristic associated with the further electrode to determine a displacement of the displacement element relative to the reference electrode.

The examples described above have also primarily focused on examples in which the electrodes comprising the capacitive sensor extended generally around the whole periphery of a displacement element. However, it will be appreciated that in other implementations the electrodes may extend only around part of the periphery. What is more, there may be multiple electrodes arranged along different parts of the periphery. For example, with reference to FIG. 1, rather than have the electrodes form a closed path around the periphery of the displacement element, the electrodes may extend only along one side. Furthermore, corresponding electrodes (and associated control circuitry) may also be provided along other sides to in effect provide a plurality of independent displacement and proximity sensors for the same displacement element 3. Each of the plurality of independent displacement and proximity sensors may operate in the manner described above to provide an indication of displacement and object proximity in their vicinity. The different electrode segments may share the same capacitance measurement circuitry in a time-multiplexed manner, or may have independent capacitance measurement circuitry.

The relative magnitude of changes in capacitance measurements for the respective sensors when operating in the displacement sensing mode can provide an indication of the location of the force giving rise to the displacement, for example by interpolation. This can be done because the magnitude of displacements at electrodes which are nearer to the location of the force applied can be expected to be larger than the magnitude of displacements at electrodes which are further from the location of the force applied. Thus, in an implementation in which independent displacement and proximity sensors are provided along each edge of a rectangular sensing element, the relative magnitudes of changes in capacitance between opposing edges can be used to estimate a location for the force applied in a direction extending between those edges. Accordingly, measurements of capacitance changes in response to a displacement from all four independent displacement and proximity sensors can provide an indication of the location of the force applied in two dimensions.

Similarly, the relative magnitude of changes in capacitance measurements for the respective sensors when operating in the proximity sensing mode can provide an indication of the location of the object giving rise to the proximity detection, for example by interpolation. This can be done because the magnitude of the capacitance change at electrodes which are nearer to the location of the object can be expected to be larger than the magnitude of the capacitance changes at the electrodes which are further from the location of the object. Thus, in an implementation in which independent displacement and proximity sensors are provided along each edge of a rectangular sensing element, the relative magnitudes of changes in capacitance between opposing edges can be used to estimate a location for the proximate object in a direction extending between those edges. Measurements of capacitance changes in response to a proximate object from all four independent displacement and proximity sensors can thus provide an indication of the location of the object over the plane of the displacement element.

Furthermore, by tracking changes in the estimated location of an object (in proximity sensing mode) or a displacement (in displacement sensing mode), a capacitive sensor in accordance with certain embodiments of the invention may be configured to detect when particular patterns of movement, for example user hand gestures, occur and provide an output signal to indicate this. A device in which the capacitive sensor is incorporated may thus response to the gesture accordingly.

Thus, by providing multiple independent sensing segments around the periphery of a displacement element it can be possible to estimate the location, and track the movement of, an object in the proximity sensing mode and/or the location of load giving rise to displacement in the displacement sensing mode. Although this has been described by way of example in the context of four independent displacement/proximity sensors around the edges of a rectangular displacement element, will be appreciated that the same principles can be applied for different shapes of displacement element and different numbers of sensing segments, for example two, three, four or more independent measurements can be made for different locations on the displacement element. Measurements from multiple independent sensing elements can also be combined to provide a single integrated value.

It will be appreciated that while specific materials and dimensions for various elements have been provided by way of specific example, in general the materials and overall geometry of the elements comprising the capacitive sensor may be selected according to the application at hand, example accords with a large or small area capacitive sensor is desired. The exact arrangement adopted for any specific information may be determined empirically, for example by testing the response of different configurations and selecting a configuration providing a desired response (for example in terms of sensitivity/rejection of spurious displacement detections). It will be further realized that while the above descriptions have focussed on a generally planar displacement element 3, the principles described herein are equally applicable to non-planar structures. For example, the same principles could be used to sense displacement on a touch sensitive system that incorporates a curved outer surface.

Thus there has been described a capacitive sensor comprising: a first electrode; a displacement element moveably mounted relative to the first electrode; and a second electrode coupled to the displacement element so that displacement of the displacement element along a displacement direction changes a separation between the first electrode and the second electrode; and a controller element configured to selectively operate in a displacement sensing mode and in a proximity sensing mode, wherein in the displacement sensing mode, the controller element is configured to electrically couple the second electrode to a reference potential and to electrically couple the first electrode to capacitance measurement circuitry to measure a capacitance characteristic of the first electrode to determine a displacement of the displacement element relative to the reference electrode; and in the proximity sensing mode, the controller element is configured to electrically couple the second electrode to capacitance measurement circuitry to measure a capacitance characteristic associated with the second electrode to detect the presence of an object in proximity to the second electrode; and in the displacement sensing mode, the controller element is configured to electrically couple the second electrode to a reference potential signal.

Further particular and preferred aspects of the present invention are set out in the accompanying independent and dependent claims. It will be appreciated that features of the dependent claims may be combined with features of the independent claims in combinations other than those explicitly set out in the claims.

REFERENCES

[1] Capacitive Sensors: Design and Applications by Larry K. Baxter, August 1996, Wiley-IEEE Press, ISBN: 978-0-7803-5351-0

What is claimed is:

1. A capacitive sensor comprising:
    a first electrode;
    a displacement element moveably mounted relative to the first electrode; and a second electrode coupled to the displacement element so that displacement of the displacement element along a displacement direction changes a separation between the first electrode and the second electrode; and
    a controller element configured to selectively operate in a displacement sensing mode and in a proximity sensing mode, wherein
    in the proximity sensing mode, the controller element is configured to electrically couple the second electrode to capacitance measurement circuitry to measure a capacitance characteristic associated with the second electrode to detect the presence of an object in proximity to the second electrode; and
    in the displacement sensing mode, the controller element is configured to electrically couple the second electrode to a reference potential signal,
    wherein the controller element is further configured when operating in the proximity sensing mode to electrically couple the first electrode to a time varying drive signal corresponding to a time varying drive signal applied to the second electrode by the capacitance measurement circuitry.

2. The capacitive sensor of claim 1, wherein the controller element is further configured in the displacement sensing mode to electrically couple the first electrode to capacitance measurement circuitry to measure a capacitance characteristic associated with the first electrode to determine a displacement of the displacement element relative to the reference electrode.

3. The capacitive sensor of claim 1, wherein the controller element is further configured in the displacement sensing mode to electrically couple a further electrode which is mounted to the displacement element and capacitively coupled to the reference electrode to capacitance measurement circuitry to measure a capacitance characteristic associated with the further electrode to determine a displacement of the displacement element relative to the reference electrode.

4. The capacitive sensor of claim 1, wherein the controller element is further configured when operating in the proximity sensing mode to electrically decouple the first electrode from the capacitance measurement circuitry so it is electrically floating.

5. The capacitive sensor of claim 2, wherein a gain of the capacitance measurement circuitry for measuring the capacitance characteristic in the displacement sensing mode is different from a gain of the capacitance measurement circuitry for measuring the capacitance characteristic associated with the second electrode in the proximity sensing mode.

6. The capacitive sensor of claim 1, wherein the first electrode comprises a first conductive trace mounted to a frame element.

7. The capacitive sensor of claim 1, wherein the second electrode comprises a second conductive trace mounted to the displacement element.

8. The capacitive sensor of claim 1, wherein the second electrode comprises a deformable electrode arranged between the displacement element and the first electrode, wherein the deformable electrode has a contact surface facing the first electrode and insulated therefrom by an insulator layer, and wherein at least part of the contact surface is inclined relative to an opposing surface of the first electrode such that when the deformable electrode is compressed along the displacement direction by a displacement of the displacement element relative to the first electrode there is a reduction in separation between the contact surface and the opposing surface of the first electrode.

9. The capacitive sensor of claim 8, wherein the inclination of the at least part of the contact surface relative to the opposing surface of the first electrode is provided by virtue of at least a portion of one of the contact surface and the opposing surface comprising a curved surface.

10. The capacitive sensor of claim 8, wherein the deformable electrode comprises a conductive foam material and/or a conductive rubber material and/or a conductive plastics material and/or a sprung metallic material and/or a flexible conductive sheath surrounding a deformable core.

11. The capacitive sensor of claim 1, wherein the displacement element is movably mounted relative to the first electrode using a resiliently compressible support element.

12. The capacitive sensor of claim 1, wherein a capacitance characteristic measured by the capacitance measurement circuitry in the displacement sensing mode is a self-capacitance of the first electrode or a further electrode mounted to the displacement element and capacitively coupled to the first electrode.

13. The capacitive sensor of claim 1, wherein the capacitance characteristic measured by the capacitance measurement circuitry in the proximity sensing mode is a self-capacitance of the second electrode.

14. The capacitive sensor of claim 1, wherein the controller element is configured when in the displacement sensing mode to generate a displacement output signal to indicate when the controller element determines there has been a displacement of the displacement element relative to the first electrode.

15. The capacitive sensor of claim 1, wherein the controller element is configured when in the displacement sensing mode to determine there has been a displacement of the displacement element relative to the first electrode by comparing a difference between two measurements of a capacitance characteristic associated with the first electrode or a further electrode mounted to the displacement element and capacitively coupled to the first electrode with a displacement trigger threshold.

16. The capacitive sensor of claim 1, wherein the controller element is configured when in the proximity sensing mode to generate a proximity output signal to indicate when the controller element determines there is an object in proximity to the second electrode.

17. The capacitive sensor of claim 1, wherein the controller element is configured when in the proximity sensing mode to determine there is an object in proximity to the second electrode by comparing a difference between two measurements of the capacitance characteristic associated with the second electrode with a proximity trigger threshold.

18. The capacitive sensor of claim 1, wherein the first electrode and the second electrode are aligned with a path running around at least a part of a peripheral region of the displacement element.

19. The capacitive sensor of claim 1, wherein the first electrode comprises a plurality of first electrode portions, and wherein when in the displacement sensing mode, the controller element is configured to electrically couple the respective first electrode portions to capacitance measurement circuitry to separately measure a capacitance characteristic for respective ones of the first electrode portions or corresponding further electrode portions mounted to the displacement element and capacitively coupled to the respective first electrode portions to determine displacements of the displacement element relative to respective ones of the first electrode portions.

20. The capacitive sensor of claim 19, wherein the controller element is further configured to estimate a location of a displacement force applied to the displacement element from a comparison of the capacitance characteristics measured for respective ones of the first electrode portions.

21. The capacitive sensor of claim 1, wherein the second electrode comprises a plurality of second electrode portions, and wherein when in the proximity sensing mode, the controller element is configured to electrically couple the respective second electrode portions to the capacitance measurement circuitry to separately measure the capacitance characteristic for respective ones of the second electrode portions to detect the presence of an object in proximity to respective ones of the second electrode portions.

22. The capacitive sensor of claim 21, wherein the controller element is further configured to estimate a location of an object in proximity to the second electrode from a comparison of the capacitance characteristics measured for respective ones of the second electrode portions.

23. The capacitive sensor of claim 22, wherein the controller element is further configured to estimate a gesture made by an object in proximity to the second electrode from changes in a sequence of estimate a locations for the object.

24. The capacitive sensor of claim 1, wherein the controller element is configured to alternate between the proximity sensing mode and the displacement sensing mode in accordance with a predefined schedule.

25. The capacitive sensor of claim 1, wherein on detection of a displacement, the controller element is configured to remain in the displacement sensing mode until it is determined there is longer a displacement.

26. An apparatus comprising the capacitive sensor of claim 1.

27. The apparatus of claim 26, wherein the apparatus comprises further circuitry configured to be electrically isolated from the capacitance measurement circuitry of the capacitive sensor.

28. The apparatus of claim 27, wherein the further circuitry is configured to electrically float relative to the capacitance measurement circuitry when the further circuitry is electrically isolated from the capacitance measurement circuitry.

29. The apparatus of claim 27, wherein the further circuitry is electrically coupled to a time varying drive signal corresponding to a time varying drive signal used by the capacitance measurement circuitry for measuring the capacitance characteristic.

30. A method of capacitive sensing comprising:
providing a capacitive senor comprising
a first electrode;
a displacement element moveably mounted relative to the first electrode; and
a second electrode coupled to the displacement element so that displacement of the displacement element along a displacement direction changes a separation between the first electrode and the second electrode; and
selectively operating in one of a displacement sensing mode and a proximity sensing mode, wherein
in the proximity sensing mode, the second electrode is electrically coupled to capacitance measurement circuitry to measure a capacitance characteristic associated with the second electrode to detect the presence of an object in proximity to the second electrode; and in the displacement sensing mode, the second electrode is electrically coupled to a reference potential signal, and wherein when in the proximity sensing mode, the first electrode is electrically coupled to a time varying drive signal corresponding to a time varying drive signal applied to the second electrode by the capacitance measurement circuitry.

31. A capacitive sensor comprising:
a first electrode;
a displacement element moveably mounted relative to the first electrode; and a second electrode coupled to the displacement element so that displacement of the displacement element along a displacement direction changes a separation between the first electrode and the second electrode; and
a controller element configured to selectively operate in a displacement sensing mode and in a proximity sensing mode, wherein
in the proximity sensing mode, the controller element is configured to electrically couple the second electrode to capacitance measurement circuitry to measure a capacitance characteristic associated with the second electrode to detect the presence of an object in proximity to the second electrode; and
in the displacement sensing mode, the controller element is configured to electrically couple the second electrode to a reference potential signal, and
wherein the second electrode comprises a deformable electrode arranged between the displacement element and the first electrode, wherein the deformable electrode has a contact surface facing the first electrode and insulated therefrom by an insulator layer, and wherein at least part of the contact surface is inclined relative to an opposing surface of the first electrode such that when the deformable electrode is compressed along the displacement direction by a displacement of the displacement element relative to the first electrode there is a reduction in separation between the contact surface and the opposing surface of the first electrode.

* * * * *